(12) United States Patent
Narayanan et al.

(10) Patent No.: US 10,038,429 B1
(45) Date of Patent: Jul. 31, 2018

(54) HIGH-SPEED SOFT-EDGE SENSE-AMPLIFIER-BASED FLIP-FLOP

(71) Applicant: QUALCOMM Incorporated, San Diego, CA (US)

(72) Inventors: Venkat Narayanan, San Diego, CA (US); Qi Ye, San Diego, CA (US); Manish Srivastava, Bangalore (IN); Venugopal Boynapalli, San Marcos, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/683,691

(22) Filed: Aug. 22, 2017

(51) Int. Cl.
*H03K 3/3562* (2006.01)
*H03K 3/013* (2006.01)
*H03K 3/356* (2006.01)

(52) U.S. Cl.
CPC ......... *H03K 3/35625* (2013.01); *H03K 3/013* (2013.01); *H03K 3/356139* (2013.01)

(58) Field of Classification Search
CPC .. H03K 3/012; H03K 3/013; H03K 3/356034; H03K 3/356043; H03K 3/356104; H03K 3/35613; H03K 3/356139; H03K 3/35625
See application file for complete search history.

(56) References Cited

U.S. PATENT DOCUMENTS

| | | | | |
|---|---|---|---|---|
| 6,642,763 | B2 * | 11/2003 | Dike | H03K 3/0375 327/198 |
| 7,057,421 | B2 * | 6/2006 | Shi | H03K 3/012 327/55 |
| 7,173,469 | B1 | 2/2007 | Rezeanu | |
| 7,692,466 | B2 | 4/2010 | Ahmadi | |
| 7,760,117 | B1 * | 7/2010 | Chou | H03K 3/356121 327/51 |
| 7,772,889 | B2 | 8/2010 | Naffziger | |
| 9,548,089 | B2 | 1/2017 | Liles et al. | |
| 9,612,281 | B2 | 4/2017 | Lou et al. | |

OTHER PUBLICATIONS

Dellen S.J., et al., "Design and implementation of Soft-Edge Flip-Flops for x86-64 AMD Microprocessor Modules", Custom Integrated Circuits Conference (CICC), 2012 IEEE, Sep. 9-12, 2012, pp. 1-4.

* cited by examiner

*Primary Examiner* — Patrick O'Neill
(74) *Attorney, Agent, or Firm* — Haynes and Boone, LLP (36340)

(57) ABSTRACT

A flip-flop is provided that includes a sense-amplifier-based master latch clocked by a first edge of a delayed version of a clock signal. A slave latch includes a cross-coupled pair of logic gates for latching a data output signal responsive to a second edge of the clock signal.

22 Claims, 6 Drawing Sheets

HIGH-SPEED SOFT-EDGE SENSE-AMPLIFIER-BASED FLIP-FLOP

TECHNICAL FIELD

This application relates to flip-flops, and more particularly to a high-speed jitter-tolerant sense-amplifier-based flip-flop.

BACKGROUND

In a traditional master-slave flip-flop, the master and slave latches are transparent on complementary clock states. For example the master latch may be configured to be transparent (and thus able to latch the incoming data) when the clock is high. The master is then closed when the clock is low. Similarly, the slave latch may be configured to be transparent when the clock is low and closed when the clock is high. Alternatively, the master latch may be configured to transparent when the clock is low whereas the slave latch would then be transparent when the clock is high. In one clock cycle, the master latch thus captures the data on a first clock edge that is then latched by the slave latch in a subsequent second clock edge in the same clocking period. In a serial chain of such flip-flops, the data output from a slave latch in one flip-flop is the data input to the master latch in a subsequent flip-flop. A data bit latched in one flip-flop during a first clock cycle is thus latched in a subsequent flip-flop in a subsequent second clock cycle.

During relatively low-speed operation, the transfer from one flip-flop to a subsequent flip-flop is relatively straightforward as the relatively slow clocking speed provides ample setup timing margins in the timing path coupling the flip-flops. But in a high-speed design, the increased clocking speed makes it difficult for the subsequent flip-flop to capture its data at the clock-triggering edge because the setup time of the flip-flop together with the data propagation delay in the timing path between the flip-flops may approach or exceed the clock cycle period. Moreover, clock jitter reduces the effective time available in the clock cycle for data propagation and setup time. If the jitter, data propagation delay, and setup time together are longer than the clock cycle, the incoming data value will not be properly captured by the subsequent flip-flop. This erroneous operation is denoted as a setup timing failure.

To provide more robust high-speed performance despite clock jitter, it is thus known to provide a flip-flop in which the clocking of the master latch is delayed with respect to the clocking of the slave latch. The delayed clock to the master latch provides sufficient setup margin despite the existence of clock jitter such that the resulting flip-flop may be designated as "jitter-tolerant" (JT) flip-flop. Alternatively, the flip-flop may be denoted as a "soft-edge" flip-flop because the clock edge for the master has been delayed (softened) with regard to the arrival of the data. Without the delayed clock, a setup violation occurs if the data arrives after the clock edge due to jitter. But the delayed clock edge is thus softened with regard to such an early arrival of the data. As a result, setup margin (the required minimum amount of setup time) for the JT flip-flop may be reduced although this comes at the cost of an increased hold margin (the required minimum amount of hold time).

In contrast to a traditional master-slave flip-flop, senseamplifier-based flip-flops are not amenable to soft-edge techniques because the slave latch is an asynchronous setreset (SR) latch. The sense amplifier within a master latch for a sense-amplifier-based flip-flop includes a differential pair of transistors that respond to a data input signal and its complement by developing a differential voltage across their drain terminals. The sense amplifier also includes a pair of cross-coupled inverters that function with positive feedback to amplify the difference between the drain voltages for the differential pair such that an output voltage for each of the cross-coupled inverters quickly develops rail-to-rail (to the power supply voltage or to ground). The inverter output voltages form the set and reset signal for the asynchronous SR slave latch. Although a sense-amplifier-based flip-flop is thus advantageously faster than traditional master-slave flipflops, delaying the clocking of the master-latch provides no benefit due to the asynchronicity of the slave latch.

There is thus a need in the art for jitter-tolerant senseamplifier-based flip-flops.

SUMMARY

A sense-amplifier-based flip-flop is provided in which a master latch is triggered by a delayed version of a first edge of a clock signal to determine a binary state for a set signal and for a reset signal responsive to a data input signal. A slave latch for the sense-amplifier-based master latch is triggered by a second edge of the clock signal to latch a binary state for a data output signal based upon the binary state of the set and reset signal. But slave latch does not suffer from the delayed evaluation of the set and reset signals in the master latch because the slave latch is also configured to be triggered by the first edge of the signal to determine the binary state of the data output signal responsive to the data input signal.

These advantageous features may be better appreciated from the following detailed description of example embodiments.

BRIEF DESCRIPTION OF THE DRAWINGS

Aspects of the present disclosure and their advantages are best understood by referring to the detailed description that follows. It should be appreciated that like reference numerals are used to identify like elements illustrated in one or more of the figures.

DETAILED DESCRIPTION

A sense-amplifier-based flip-flop is provided in which an SR slave latch is modified to be synchronous. Such a modified SR slave latch is denoted herein a complex SR slave latch. The complex SR slave latch includes a crosscoupled pair of logic gates that are triggered by a second edge of a clock signal to latch a data output (q) signal responsive to a determination of a set and reset signal in a sense-amplifier-based master latch. But the complex SR slave latch is also triggered by a first edge of the clock signal to determine a binary state for the data output signal responsive to a binary state for a data input signal.

The resulting synchronous data evaluation in the complex SR slave latch is quite advantageous because the clocking of the master latch may then be delayed so that the resulting sense-amplifier-based flip-flop is jitter tolerant. As compared to the complex SR slave latch, the master latch is triggered by a delayed version of the first edge of the clock signal to evaluate the data input signal to determine the binary state for the set and reset signals. The increased evaluation time in the master latch does not penalize the clock-to-q (clk2q) delay in the complex SR latch because of the data evaluation in the slave latch responsive to the first edge of the clock signal. As compared to the first edge of the clock signal, the delayed first edge of the clock signal allows the master latch to latch the input data signal even if the clock signal is subject to jitter such that it would be unable to latch the data using the non-delayed clock signal. In other words, the data may arrive after the first edge of the clock signal but still be latched responsive to the delayed first edge in the master latch.

Figure 1:
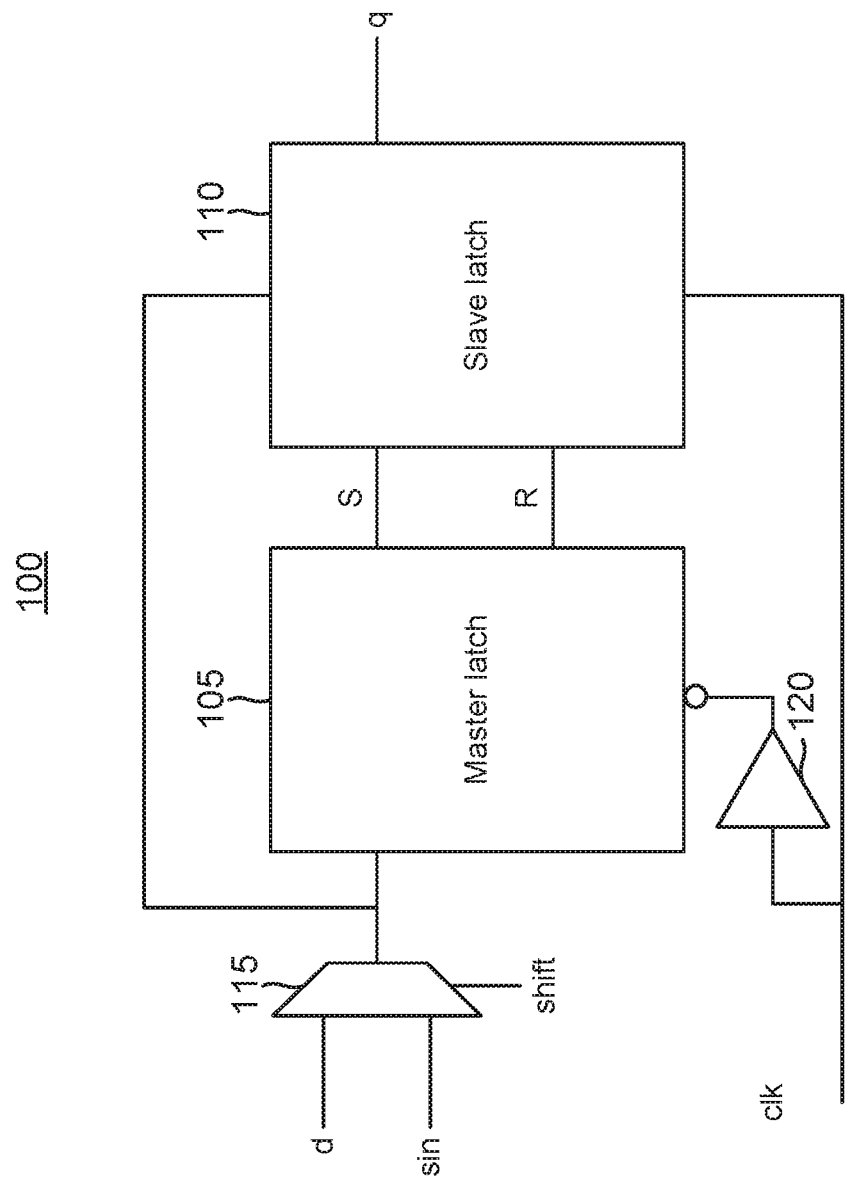
FIG. 1 is a diagram of a sense-amplifier-based flip-flop in accordance with an aspect of the disclosure.

An example sense-amplifier-based flip-flop 100 is shown in FIG. 1. A multiplexer 115 selects between the data input (d) signal and a shift-in (sin) signal responsive to a shift signal. During normal operation, multiplexer 115 selects for the data input signal so that it may be latched in flip-flop 100 to form a data output (q) signal. But during a test operation, multiplexer 115 selects for the shift-in signal as known in the testing arts. Since such testing is conventional, the following discussion will focus on the jitter-tolerant operation of flip-flop 100 during normal operation. As is conventional in a sense-amplifier-based flip-flop architecture, a master latch 105 includes a sense amplifier having a differential pair of transistors (not shown in FIG. 1) that respond to the data input signal and its complement so as to develop a differential voltage across their drain terminals. The sense amplifier further includes a pair of cross-coupled inverters that drive their output nodes to develop a set signal and a reset signal responsive to amplifying the differential voltage with positive feedback. Master latch 105 thus provides the enhanced speed of a sense-amplifier-based flip-flop. But this evaluation of the set and reset signals is not responsive to the first edge of a clock (clk) signal but instead is responsive to the first edge of a delayed version of the clock signal as produced by a delay circuit 120.

A complex SR slave latch 110 includes a pair of cross-coupled logic gates (not shown in FIG. 1) that latch a data output (q) signal responsive to the determination of the set and reset signals in master latch 105. But complex SR slave latch 110 is synchronous such that it evaluates the data input signal responsive to the first edge of the clock signal. The clock-to-Q time for complex SR slave latch 110 is thus not penalized by the delayed determination of the set and reset signals in master latch 105. Yet complex SR slave latch 110 is then triggered by a second edge of the clock signal to latch the data output signal responsive to the determination of the set and reset signals in master latch 105. Flip-flop 100 is thus jitter tolerant despite master latch 105 latching the input data using a sense amplifier.

Figure 2:
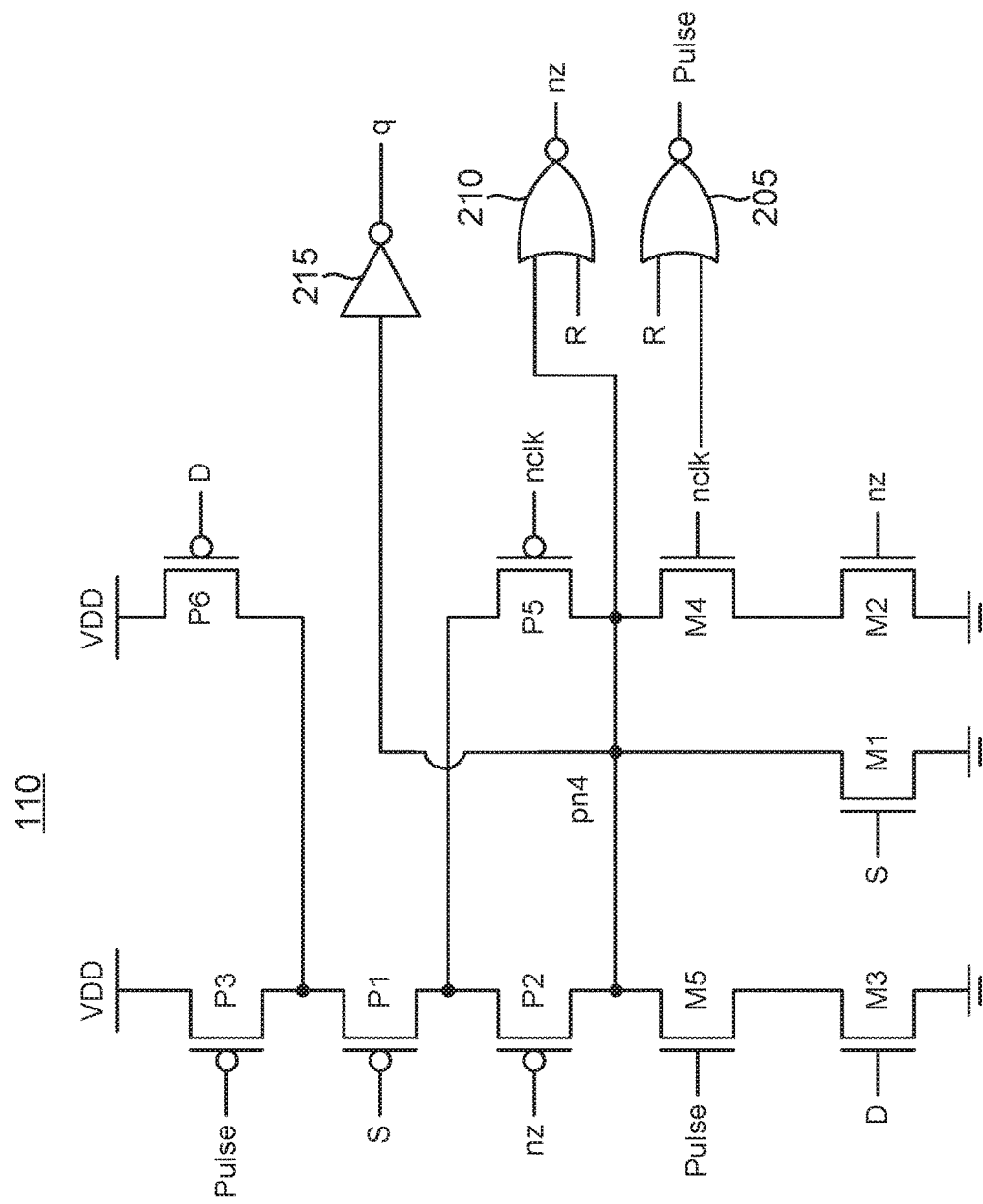
FIG. 2 is a circuit diagram of the slave latch for a PMOS embodiment of the flip-flop of FIG. 1 in accordance with an aspect of the disclosure.

Some example circuit implementations for flip-flop 100 will now be discussed in more detail. The differential pair of transistors in master latch 105 are NMOS transistors in an NMOS embodiment for flip-flop 100. Alternatively, the differential pair of transistors are PMOS transistors in a PMOS embodiment for flip-flop 100. A PMOS embodiment for flip-flop 100 will be discussed first with regard to a complex SR slave latch 110 as shown in FIG. 2. As would be conventional for an SR slave latch, complex SR slave latch 110 includes a cross-coupled pair of logic gates for latching a data output signal. In particular, slave latch 110 includes a pair of cross-coupled NOR gates that are responsive to the set (S) and reset (R) signals. A first NOR gate 210 in the cross-coupled pair NORs an output signal pn4 from a second NOR gate and the reset signal R to form an output signal nz. The second NOR gate in the cross-coupled pair is formed by a PMOS transistor P1, a PMOS transistor P2, an NMOS transistor M1 and an NMOS transistor M2. The drain of transistor P1 connects to a source of transistor P2. The drain of transistor P2 connects to the drain of transistor M1. The drain of transistor M2 couples to the drain of transistor P2 through an NMOS transistor M4 having its gate driven by an inverted version (nclk) of the clock signal. Thus, when the clock signal goes low, nclk goes high to switch on transistor M4 so that transistors M1 and M2 couple in parallel to the drain of transistor P2. The set signal S drives the gates of transistors P1 and M1 whereas the nz signal drives the gates of transistors M2 and P2. The sources of transistors M1 and M2 are connected to ground.

Since the output signal pn4 of the resulting NOR gate formed by transistors P1, P2, M1, and M2 drives the input of NOR gate 210, the two NOR gates are cross-coupled to form an SR latch. However, it is not a conventional SR latch because a NOR gate 205 NORs the inverted clock signal and the reset signal to form a pulse signal. As will be explained further herein, master latch 105 is designed so that the set and reset signals are both logical zeroes in an PMOS embodiment (grounded in a logic-high embodiment) while a delayed version of the inverted clock signal is high. Prior to the falling edge of the inverted clock signal, the reset signal is thus low such that the pulse signal will be pulsed high when the inverted clock signal goes low. Since master latch 105 is receiving a delayed version of the inverted clock, it will not yet have evaluated the reset signal and the set signal when the pulse signal goes high (as used herein, a signal is deemed to be high when it is charged to the power supply voltage and deemed to be low when discharged to ground). The pulse signal drives a gate of an NMOS transistor M5 having its drain connected to the drain of transistor P2, which supplies the signal pn4. The source of transistor M5 connects to the drain of an NMOS transistor M3 having its source connected to ground. The data input signal drives the gate of transistor M3. Should the data input signal be a binary one (asserted high in a logic-high embodiment), the pn4 signal will thus be grounded following the falling edge of the inverted clock. An inverter 215 inverts the pn4 signal to form the data output signal q. Since the clock signal is delayed to master latch 105, it will still be evaluating the binary-high state of the data signal to then assert the set signal while transistor M3 in slave latch 110 functions to evaluate the data input signal to drive output data signal q high accordingly. Once master latch 105 has finished asserting the set signal, transistor M1 will be switched on to maintain the low state for the pn4 signal. At the rising edge of the inverted clock, the pulse signal goes low so that transistor M5 is switched off. The rising edge of the inverted clock signal switches on transistor M4. The high state for output signal nz from NAND gate 210 keeps transistor M2 on such that the pn4 output signal is maintained low through transistors M4 and M2. The cross-coupled NOR gates in slave latch 110 will thus latch the desired binary-high state of the data output signal at the rising edge of the inverted clock signal.

The data signal also drives a gate of a PMOS transistor P6 in slave latch 110. The source of transistor P6 is tied to the power supply node supplying the power supply voltage VDD and its drain is connected to the source of transistor P1. Should the data signal instead be low at the rising edge of the pulse signal following the falling edge of the inverted clock signal, transistors P5, P6, and P1 will be on to charge the pn4 signal high such that the data output signal is brought low. Master latch 105 will then finish evaluating the data input signal to assert the reset signal such that NOR gate 210 de-asserts its output signal nz low to switch on transistor P2. The set signal is maintained low to keep transistor P1 on. The assertion of the reset signal also causes NOR gate 205 to drive the pulse signal low to switch on transistor P3. At the rising edge of the inverted clock signal, the high state for output signal pn4 will thus be latched high through the cross-coupled NOR gates (NOR gate 205 being cross-coupled with the NOR gate formed by transistors P1, P2, M1, and M2). The low state for signal nz keeps transistor P2 on such that switched-on transistors P2, P1, and P3 keep output signal pn4 charged to the supply voltage VDD. The cross-coupled NOR gates thus latch the low state of the data output signal responsive to the rising edge of the inverted clock signal.

Regardless of whether the data input signal has a binary high state or a binary low state, slave latch 110 will thus function to evaluate the data input signal to determine the binary state of the data output signal while master latch 105 is still evaluating the data signal to determine the binary states of the set and reset signals. But slave latch 110 still functions as an SR latch to latch the data output signal in response to the determination of the set and reset signals by master latch 105. The resulting operation is quite advantageous being the conventional incompatibility of sense-amplifier-based flip-flops with jitter tolerant operation has hindered their adoption despite their desirably fast operation. But circuits incorporating flip-flop 100 may benefit from its sense-amplifier-based speed despite its operation being jitter tolerant. In slave latch 110, transistors P6, P1, P5, M5, and M3 may be deemed to form an evaluation circuit that is triggered by a first edge of the clock signal to determine a binary state for the data output signal responsive to the data input signal. Such an evaluation circuit may be further deemed to form a means for determining a binary state for the data output signal responsive to the first edge of the clock signal.

Figure 3:
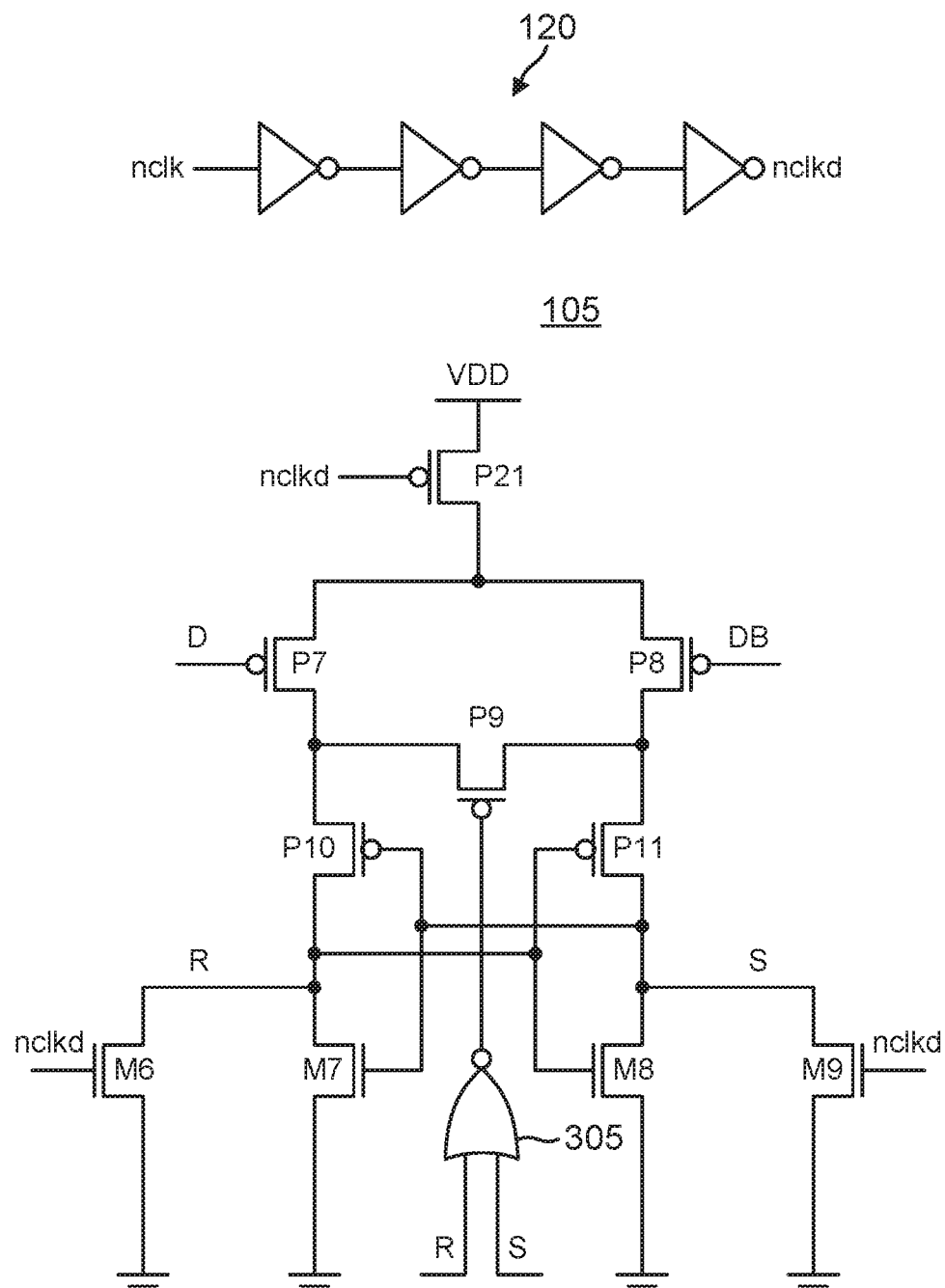
FIG. 3 is a circuit diagram of the master latch for a PMOS embodiment of the flip-flop of FIG. 1 in accordance with an aspect of the disclosure.

A master latch 105 for a PMOS embodiment of flip-flop 100 is shown in FIG. 3. A differential pair of transistors is formed by a PMOS transistor P7 and a PMOS transistor P8. The data input signal D drives the gate of transistor P7 whereas a complement data input signal DB drives the gate of transistor P8. The sources of transistors P7 and P8 connect to the power supply rail through a PMOS current source transistor P21. A delayed inverted clock signal nclkd drives the gate of current source transistor P21. Delay circuit 120 includes a serial chain of inverters to delay the inverted clock signal (nclk) into the delayed inverted clock signal (nclkd). The differential pair of transistors P7 and P8 thus are not powered unless the delayed clock is low. With the delayed clock low, the differential pair of transistors P7 and P8 can respond to the data input signal and its complement to develop a differential voltage across their drains. For example, if the input data signal D is low, the drain of transistor P7 will charge towards the power supply voltage VDD.

A pair of cross-coupled inverters amplify the differential voltage across the drains of transistors P7 and P8 through positive feedback. A first inverter in the cross-coupled pair is formed by a PMOS transistor P10 and an NMOS transistor M7. A second inverter in the cross-coupled pair is formed by a PMOS transistor P11 and an NMOS transistor M8. The source of transistor P10 connects to the drain of differential pair transistor P7 whereas its drain connects to the drain of transistor M7. The source of transistor M7 connects to ground. The remaining inverter is analogous in that the source of transistor P11 connects to the drain of differential pair transistor P8 whereas its drain connects to the drain of transistor M8. The source of transistor M8 connects to ground. The output node of the first inverter (drains of transistors P10 and M7) carries the reset signal (R). These drain nodes couple to ground through an NMOS transistor M6 whose gate is driven by the delayed inverted clock signal. Similarly, the output node of the second inverter (drains of transistors P11 and M8) carries the set signal (S). These drain nodes couple to ground through an NMOS transistor M9 whose gate is driven by the delayed inverted clock signal. When the delayed inverted clock is high, the set and reset signals will thus be grounded. The reset signal drives the input of the second inverter (gates of transistors P11 and M8). Similarly, the set signal drives the input of the first inverter (gates of transistors P10 and M7).

Given the feedback through the inverters, either the set signal or the reset signal will quickly be asserted after the falling edge of the delayed inverted clock signal depending upon the binary state of the data input signal. For example, if the data input signal is high, the drain of transistor P8 will charge towards the power supply voltage. Transistor P11 will be on since the reset signal had been discharged. The set signal will thus charge to the power supply voltage VDD, which turns on transistor M7 to maintain the reset signal low. Conversely, if the data input signal is low, the reset signal will be charged in an analogous fashion while the set signal is maintained low. A PMOS bridge transistor P9 that couples between the drains of transistors P7 and P8 would traditionally have its gate clocked or tied to ground. But such traditional control of bridge transistor P9 may lead to race conditions. A NOR gate 305 thus advantageously controls the gate of transistor P9 responsive to a NOR of the set signal and the reset signal. Once one of the set and reset signals is asserted by master latch 105, the output of NOR gate 305 will go low to switch on bridge transistor P9. In this fashion, the race conditions of traditional sense-amplifier-based master latches is solved. An NMOS embodiment for flip-flop 100 will now be discussed.

Figure 4:
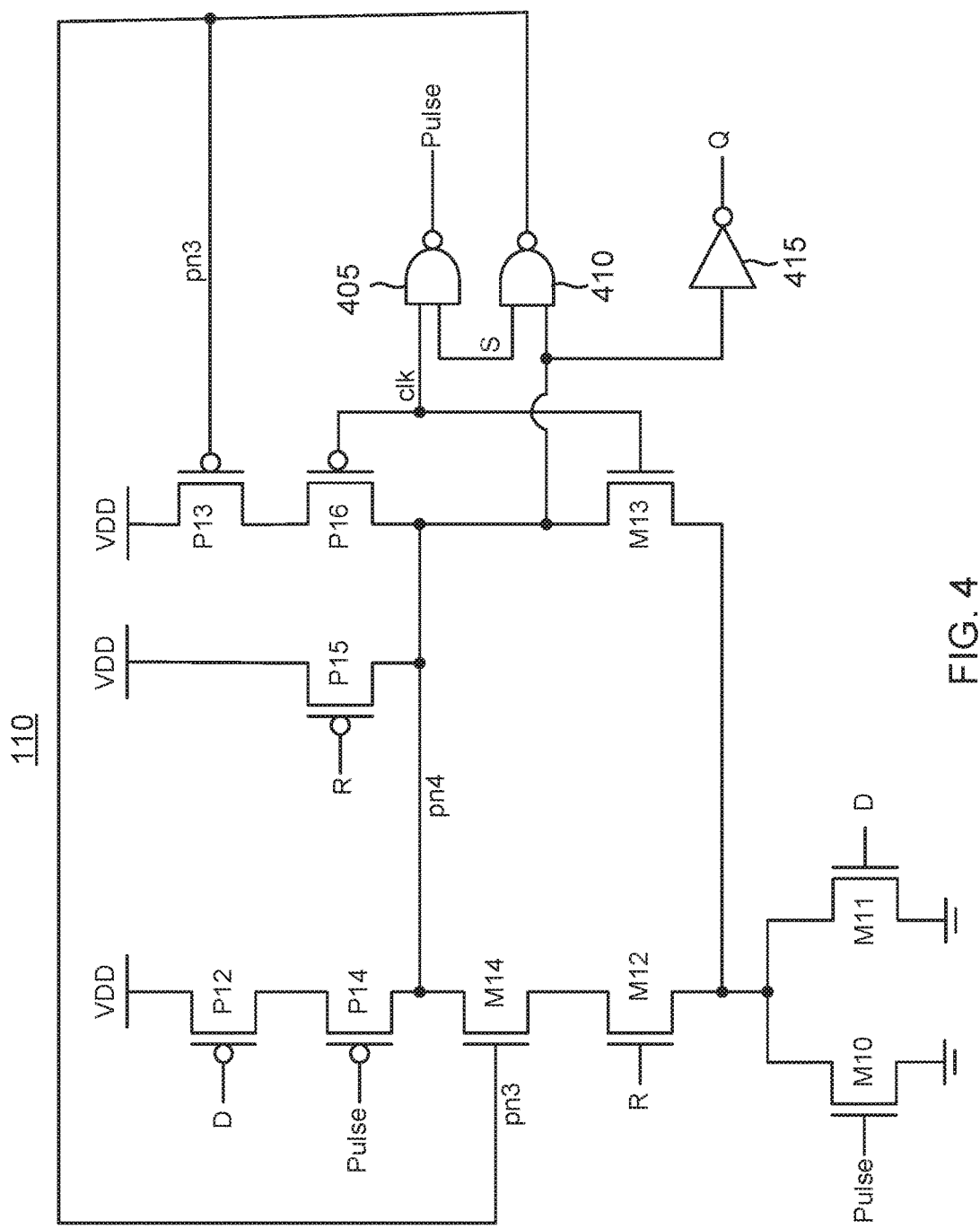
FIG. 4 is a is a circuit diagram of the slave latch for an NMOS embodiment of the flip-flop of FIG. 1 in accordance with an aspect of the disclosure.

An example slave latch 110 for an NMOS embodiment of flip-flop 100 is shown in FIG. 4. In this NMOS embodiment, the cross-coupled logic gates to form the SR latch are a pair of NAND gates. A first NAND gate 410 NANDs an output signal pn4 signal and the set signal to form an output signal pn3. A second NAND gate is formed by a PMOS transistor P13, a PMOS transistor P15, an NMOS transistor M14, and an NMOS transistor M12. This second NAND gate NANDs the reset signal and the output signal pn3 to form the output signal pn4. The sources of transistors P15 and P13 are tied to the power supply node. The drain of transistor P15 ties to a drain of transistor M14, which has a source tied to the drain of transistor M12. The reset signal drives the gates of transistors M12 and P15 whereas the pn3 output signal drives the gates of transistor P13 and M14. The drain of transistor P15 forms an output node for the second NAND gate to carry the pn4 output signal.

A third NAND gate 405 NANDs the clock signal and the set signal to produce a pulse signal. The clock signal drives a gate of a PMOS transistor P16 having its source tied to a drain of transistor P13 and having its drain connected to a drain of an NMOS transistor M13. The clock signal also drives the gate of transistor M13, which has its source tied to a source of transistor M12. The source of transistor M12 connects to a drain for an NMOS transistor M10 and an NMOS transistor M11. The sources for transistors M10 and M11 are tied to ground. The pulse signal drives the gate of transistor M10 whereas the data input signal (D) drives the gate of transistor M11. In addition, the drain of transistor M14 connects to a drain for a PMOS transistor P14 and also to the drains of transistors P15 and P16. Finally, the source of transistor P14 couples to the power supply node through a PMOS transistor P12 having its gate driven by the data input signal.

As will be explained further herein, master latch 105 is designed so that the set and reset signals are both logical ones in an NMOS embodiment (charged to VDD in a logic-high embodiment) while a delayed version of the clock signal is low such that the set and reset signals are active-low signals. Prior to the rising edge of the clock signal, the set and reset signals will thus both be charged to the power supply voltage VDD. In response to the rising edge of the clock signal, the pulse signal will pulse low to switch off transistor M10 and switch on transistor P14. Should the data input signal be low, transistor P12 is switched on such the pn4 signal will be charged to the power supply voltage VDD through transistors P12 and P14. An inverter 415 inverts the pn4 signal to produce the data output signal (q) such that the data output signal goes low. Once master latch 105 finishes evaluating the data input signal to drive the reset signal low in response to the low state for the data input signal, transistor P15 is switched on to maintain the charged state for output signal pn4. At the falling edge of the clock signal, transistor P16 is switched on. The output signal pn3 of NAND gate 410 is also low so that transistors P13 and P16 maintain signal pn3 high. The cross-coupled NAND gates thus latch the low state of the data output signal responsive to the falling edge of the clock signal.

Similarly, should the data input signal be high at the falling edge of the pulse signal following the rising edge of the clock signal, transistors M11 and M13 will both be switched on to discharge the pn4 output signal so that the data output signal goes high. Once master latch 105 finishes evaluating the data input signal, the set signal will be low and the reset signal will be high. The output signal pn3 from NAND gate 410 is high so that transistor M14 is also on. Similarly, the pulse signal is high so that transistor M10 is on. The low state of the pn4 signal is then maintained by transistors M14, M12, and M10. The high state of the output signal is thus latched by the cross-coupled action of the NAND gates responsive to the falling edge of the clock signal. In this fashion, the NMOS embodiment for slave latch 110 also enjoys the jitter-tolerant delayed clocking of master latch 105 regardless of the binary value of the data input signal and without penalizing the clock-to-q delay in slave latch 110. In slave latch 110 of FIG. 4, transistors P12, P14, M11, and M13 may be deemed to form an evaluation circuit that is triggered by a first edge of the clock signal to determine a binary state for the data output signal responsive to the data input signal. Such an evaluation circuit may be further deemed to form a means for determining a binary state for the data output signal responsive to the first edge of the clock signal.

Figure 5:
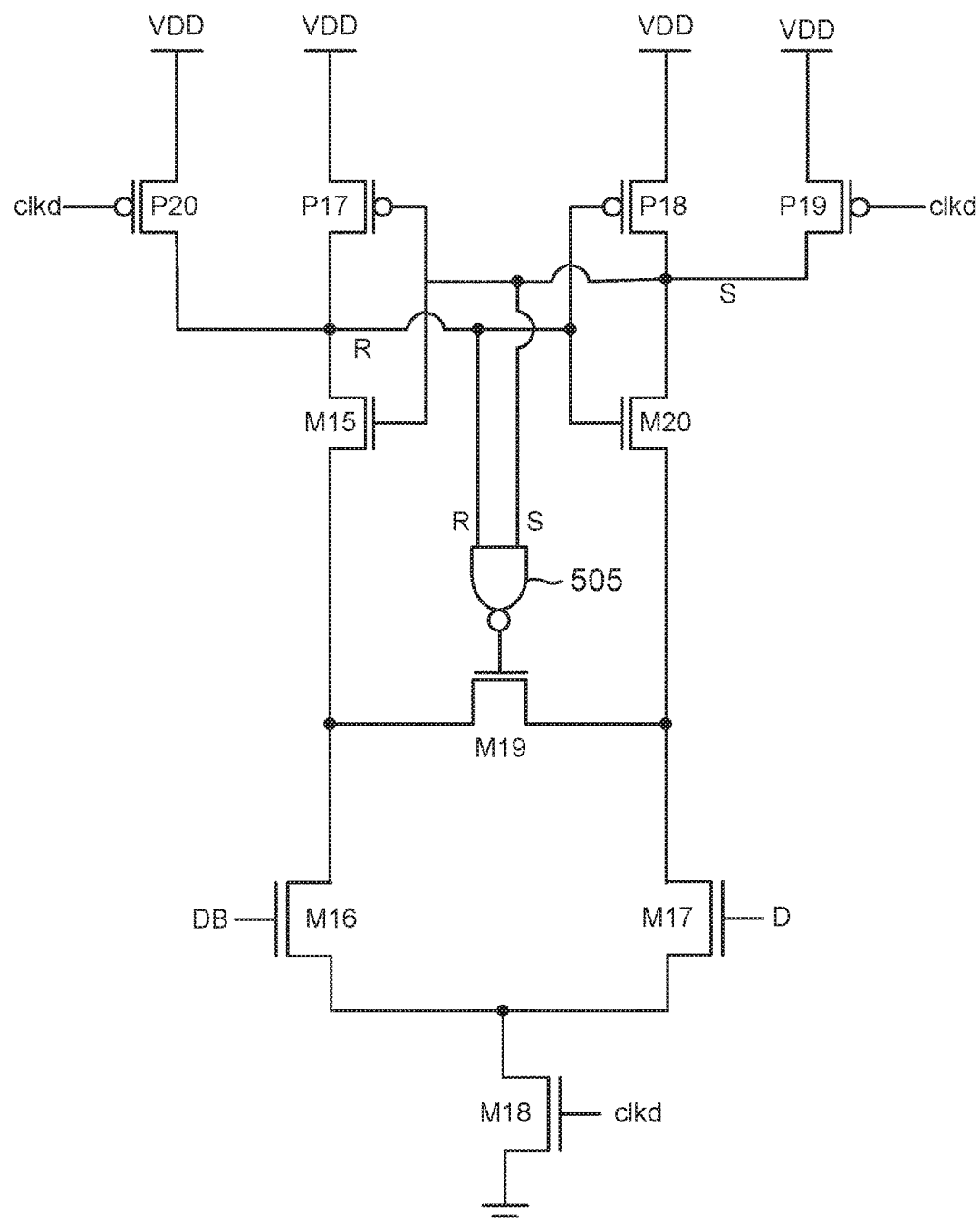
FIG. 5 is a circuit diagram of the master latch for an NMOS embodiment of the flip-flop of FIG. 1 in accordance with an aspect of the disclosure.

A master latch 105 for an NMOS embodiment of flip-flop 100 is shown in FIG. 5. A differential pair of NMOS transistors M16 and M17 both have their sources tied to ground through an NMOS transistor M18 whose gate is controlled by the delayed clock signal clkd. When the delayed clock signal is high, transistor M18 switches on so that the differential pair of transistors M16 and M17 may respond to the data input signal. In particular, the data input signal drives the gate of transistor M17 whereas the complement data input signal drives the gate of transistor M16. The drains of differential pair transistors M16 and M17 will thus develop a differential voltage in response to the binary state of the data input signal that is amplified by a pair of cross-coupled inverters. In particular, a first inverter is formed by a PMOS transistor P17 having its source tied to the power supply node and drain tied to a drain for an NMOS transistor M15. The source of transistor M15 is tied to the drain of differential pair transistor M16. Similarly, a second inverter is formed by a PMOS transistor P18 having its source tied to the power supply node and its drain tied to a drain for an NMOS transistor M20. The source of transistor M20 is tied to the drain of differential pair transistor M17. The drains of transistors P17 and M15 carry the reset signal, which drives the gates of transistors P18 and M20. Similarly the drains of transistors P18 and M20 carry the set signal, which drives the gates of transistors P17 and M15. A PMOS transistor P20 couples between the power supply node and the drains for transistors P17 and M15. The delayed clock signal drives the gate of transistor P20 to keep the reset signal charged while the delayed clock signal is low. Similarly, a PMOS transistor P19 couples between the power supply node and the drains for transistors P18 and M20. The delayed clock signal drives the gate of transistor P19 to maintain the set signal high while the delayed clock signal is low.

Suppose that the drain of transistor M16 is discharged lower than the drain of transistor M17 in response to a binary low value for the data input signal. Transistor M15 will be on due to the high state of the set signal. The reset signal will thus discharge to ground while the positive feedback through the cross-coupled inverters keeps the set signal high. Conversely, if the drain of transistor M17 is discharged lower in response to a binary high value for the data input signal, the set signal will discharge to ground whereas the positive feedback through the cross-coupled inverters will maintain the reset signal high. An NMOS bridge transistor that couples between the drains of transistors M16 and M17 is controlled by a NAND gate 505 that NANDs the set and reset condition to prevent the race conditions discussed earlier.

Figure 6:
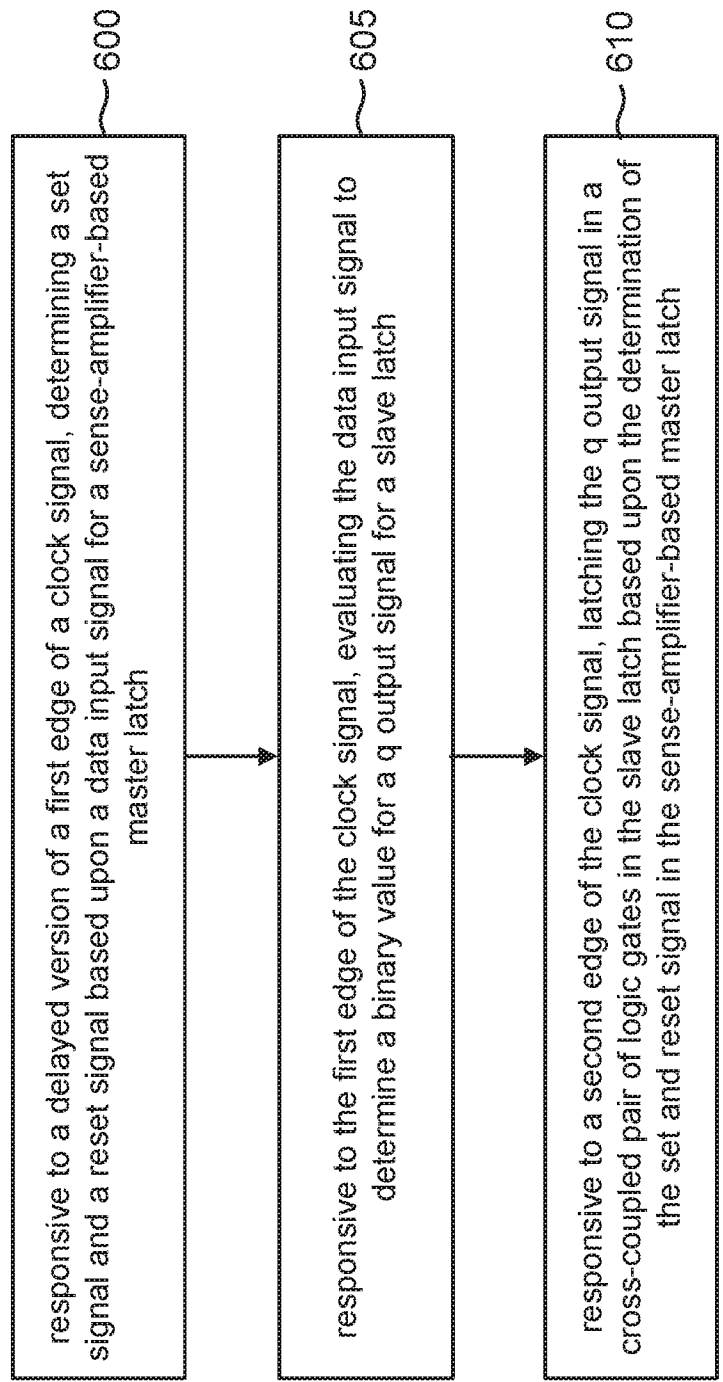
FIG. 6 is a flowchart for a method of latching a data output signal in a jitter-tolerant sense-amplifier-based flip-flop in accordance with an aspect of the disclosure.

An example method of operation of a jitter-tolerant sense-amplifier-based flip-flop will now be discussed with regard to the flowchart of FIG. 6. The method includes an act 600 that is responsive to a delayed version of a first edge of a clock signal and comprises determining a set signal and a reset signal a sense-amplifier-based master latch based upon a data input signal. The evaluation of the reset and set signals responsive to rising edge of the delayed clock signal as discussed with regard to the NMOS flip-flop embodiment of master latch 105 in FIG. 5 is an example of act 600. Alternatively, evaluation of the reset and set signals responsive to a delayed version of a falling edge of the inverted clock signal as discussed with regard to the PMOS flip-flop embodiment of master latch 105 in FIG. 3 is an example of act 600. The method further includes an act 605 of evaluating the data input signal to determine a binary value for a q output signal for a slave latch responsive to the first edge of the clock signal. The evaluation of the data input signal in slave latch 110 for an PMOS embodiment of flip-flop 1 of FIG. 4 responsive to the rising edge of the clock signal in an example of act 605. Alternatively, the evaluation of the data input signal in the PMOS flip-flop embodiment of slave latch 110 responsive to the falling edge of the inverted clock signal in an example of act 605.

Finally, the method includes an act 610 that of latching a data output signal in a cross-coupled pair of logic gates in the slave latch responsive to a second edge of the clock signal and responsive to the determination of the set and reset signal in the sense-amplifier-based master latch. For an NMOS flip-flop embodiment, the latching of the data output signal in slave latch 105 of FIG. 4 responsive to the falling edge of the clock signal and responsive to the determination of the set signal and the reset signal is an example of act 610. For a PMOS flip-flop embodiment, the latching of the data output signal in slave latch 105 of FIG. 2 responsive to the rising edge of the inverted clock signal and responsive to the determination of the set signal and the reset signal is an example of act 610.

In light of the numerous alternative embodiments discussed above, the scope of the present disclosure should not be limited to that of the particular embodiments illustrated and described herein, as they are merely by way of some examples thereof, but rather, should be fully commensurate with that of the claims appended hereafter and their functional equivalents.

We claim:

1. A flip-flop, comprising:
a master latch including a differential pair of transistors configured to be triggered by a delayed version of a first edge of a clock signal to develop a differential voltage across a pair of terminals for the differential pair of transistors responsive to a data input signal, the master latch further including a pair of cross-coupled inverters configured to determine a binary state for a set signal and a reset signal responsive to the differential voltage; and
a slave latch having an evaluation circuit configured to be triggered by the first edge of the clock signal to determine a binary state for a data output signal responsive to the data input signal, the slave latch further including a pair of cross-coupled logic gates configured to be triggered by a second edge of the clock signal to latch the binary state for the data output signal responsive to the binary state for the set signal and the reset signal.

2. The flip-flop of claim 1, wherein the differential pair of transistors comprises a first NMOS transistor configured to have a gate driven by the data input signal and a second NMOS transistor configured to have a gate driven by a complement of the data input signal, and wherein the pair of terminals is a pair of drain terminals.

3. The flip-flop of claim 2, wherein the master latch further includes:
a third NMOS transistor coupled between the pair of drain terminals; and
a logic gate configured to switch on the third NMOS transistor responsive to an assertion of the set signal or an assertion of the reset signal.

4. The flip-flop of claim 3, wherein the logic gate comprises a NAND gate.

5. The flip-flop of claim 1, wherein the differential pair of transistors comprises a first PMOS transistor configured to have a gate driven by the data input signal and a second PMOS transistor configured to have a gate driven by a complement of the data input signal, and wherein the pair of terminals is a pair of drain terminals.

6. The flip-flop of claim 5, wherein the master latch further includes:
a third PMOS transistor coupled between the pair of drain terminals; and
a logic gate configured to switch on the third PMOS transistor responsive to a de-assertion of the set signal or a de-assertion of the reset signal.

7. The flip-flop of claim 6, wherein the logic gate comprises a NOR gate.

8. The flip-flop of claim 1, wherein the cross-coupled logic gates in the slave latch comprise a pair of cross-coupled NOR gates.

9. The flip-flop of claim 1, wherein the cross-coupled logic gates in the slave latch comprise a pair of cross-coupled NAND gates.

10. The flip-flop of claim 1, wherein the delayed version of the first edge of the clock signal is a delayed version of a rising edge of the clock signal, and wherein the clock signal is an inverted clock signal.

11. The flip-flop of claim 1, wherein the delayed version of the first edge of the clock signal is a delayed version of a falling edge of the clock signal.

12. A method, comprising:
responsive to a delayed version of a first edge of a clock signal, determining within a sense-amplifier-based master latch a binary state for a set signal and a reset signal based upon a data input signal;
responsive to the first edge of the clock signal, evaluating the data input signal within a slave latch to determine a binary value for data output signal; and
latching the binary state of the data output signal in a cross-coupled pair of logic gates in the slave latch responsive to a second edge of the clock signal and responsive to the determination of the binary state for the set signal and for the reset signal.

13. The method of claim 12, wherein the first edge of the clock signal is a rising edge, and wherein the second edge of the clock signal is a falling edge.

14. The method of claim 12, wherein the first edge of the clock signal is a falling edge, and wherein the second edge of the clock signal is a rising edge.

15. The method of claim 12, further comprising:
switching on a current source transistor for a differential pair of transistors in the sense-amplifier-based master latch responsive to the delayed version of the of the first edge of the clock signal;
developing a differential voltage across a pair of drain terminals for the differential pair of transistors while the current source transistor is switched on; and
amplifying the differential voltage through a pair of cross-coupled inverters in the sense-amplifier-based master latch, wherein an output signal of a first one of the cross-coupled inverters determines the binary state for the set signal and an output signal of a second one of the cross-coupled inverters determines the binary state for the reset signal.

16. The method of claim 12, further comprising driving the output signal by inverting an input to one of the cross-coupled logic gates in the slave latch.

17. A flip-flop, comprising:
a master latch including a differential pair of transistors configured to be triggered by a delayed version of a first edge of a clock signal to develop a differential voltage across a pair of terminals for the differential pair of transistors responsive to a data input signal, the master latch further including a pair of cross-coupled inverters configured to determine a binary state for a set signal and a reset signal responsive to the differential voltage; and
a slave latch including means for determining a binary state for a data output signal responsive to the first edge of the clock signal, the slave latch further including a pair of cross-coupled logic gates configured to be triggered by a second edge of the clock signal to latch the binary state for the data output signal responsive to the binary state for the set signal and the reset signal.

18. The flip-flop of claim 17, wherein the differential pair of transistors comprises a first NMOS transistor configured to have a gate driven by the data input signal and a second NMOS transistor configured to have a gate driven by a complement of the data input signal, and wherein the pair of terminals is a pair of drain terminals.

19. The flip-flop of claim 18, wherein the master latch further includes:
a third NMOS transistor coupled between the pair of drain terminals; and
a logic gate configured to switch on the third NMOS transistor responsive to an assertion of the set signal or an assertion of the reset signal.

20. The flip-flop of claim 19, wherein the logic gate comprises a NAND gate.

21. The flip-flop of claim 17, wherein the differential pair of transistors comprises a first PMOS transistor configured to have a gate driven by the data input signal and a second PMOS transistor configured to have a gate driven by a complement of the data input signal, and wherein the pair of terminals is a pair of drain terminals.

22. The flip-flop of claim 21, wherein the master latch further includes:
a third PMOS transistor coupled between the pair of drain terminals; and
a logic gate configured to switch on the third PMOS transistor responsive to a de-assertion of the set signal or a de-assertion of the reset signal.

* * * * *